United States Patent
Nishikawa et al.

(10) Patent No.: US 6,967,378 B2
(45) Date of Patent: Nov. 22, 2005

(54) SEMICONDUCTOR INTEGRATED CIRCUIT DEVICE CONFIGURED TO PREVENT THE GENERATION OF A REVERSE CURRENT IN A MOS TRANSISTOR

(75) Inventors: Nobuhiro Nishikawa, Kyoto (JP); Koichi Inoue, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 10/786,296

(22) Filed: Feb. 26, 2004

(65) Prior Publication Data

US 2004/0169237 A1 Sep. 2, 2004

(30) Foreign Application Priority Data

Feb. 27, 2003 (JP) .............................. 2003-050643

(51) Int. Cl.⁷ .............................. H01L 23/62; H02H 3/24
(52) U.S. Cl. ...................... 257/355; 257/360; 257/363; 361/56
(58) Field of Search .................. 257/355–363; 361/56; 307/296.2

(56) References Cited

U.S. PATENT DOCUMENTS

| | | | |
|---|---|---|---|
| 243,236 A | * | 6/1881 | McDaniel .................. 172/496 |
| 3,967,295 A | * | 6/1976 | Stewart ........................ 257/358 |
| 4,066,918 A | * | 1/1978 | Heuner et al. ............... 327/318 |
| 4,303,958 A | * | 12/1981 | Allgood ....................... 361/100 |
| 5,159,207 A | * | 10/1992 | Pavlin et al. ................. 327/534 |
| 5,243,236 A | * | 9/1993 | McDaniel ..................... 326/68 |
| 5,326,994 A | * | 7/1994 | Giebel et al. ................ 257/174 |

FOREIGN PATENT DOCUMENTS

| | | |
|---|---|---|
| JP | 60-163113 | 8/1985 |
| JP | 11-087628 | 3/1999 |

* cited by examiner

*Primary Examiner*—Ori Nadav
(74) *Attorney, Agent, or Firm*—Arent Fox PLLC

(57) ABSTRACT

A semiconductor integrated circuit device has a MOS transistor M2 including a parasitic diode Dx2 for preventing a reverse current due to a parasitic diode Dx1 of a MOS transistor M1. The semiconductor integrated circuit device further has a voltage setting circuit 1 for turning the MOS transistor M2 off in a reversely biased state, and an anti-reverse-current element 2 for preventing a reverse current from flowing through the voltage setting circuit 1 in a reversely biased state. In normal operation, a direct-current voltage within the withstand voltage range of the MOS transistor M2 is fed to the gate thereof according to the voltage applied to the conductive terminal 6y of the MOS transistor M2.

5 Claims, 2 Drawing Sheets

SEMICONDUCTOR INTEGRATED CIRCUIT DEVICE CONFIGURED TO PREVENT THE GENERATION OF A REVERSE CURRENT IN A MOS TRANSISTOR

This application is based on Japanese Patent Application No. 2003-050643 filed on Feb. 27, 2003, the contents of which are hereby incorporated by reference.

BACKGROUND OF THE INVENTION

1. Field of the Invention

The present invention relates to a semiconductor integrated circuit device that employs a MOS transistor, and in particular to a semiconductor integrated circuit device that is so configured as to prevent generation of a reverse current in a MOS transistor.

2. Description of the Prior Art

In a semiconductor integrated circuit device, there is often included a P-channel MOS transistor M1 having a supply voltage Vdd applied to a P-type diffusion layer and a backgate thereof as shown in FIG. 4A. As shown in FIG. 4B, this MOS transistor M1 is provided with P-type diffusion layers 11 and 12, an N-type diffusion layer 14 functioning as a backgate, and a gate formed on the surface of an N-type well layer 10 with an insulating film 13 laid in between. Here, the P-type diffusion layer 11, the N-type well layer 10, and the N-type diffusion layer 14, i.e., the backgate, together form a PN junction that functions as a parasitic diode Dx.

Thus, when the MOS transistor M1 is reversely biased, a reverse current flows from the P-type diffusion layer 11 through the parasitic diode Dx to the P-type diffusion layer 12 and to the N-type diffusion layer 14. To prevent this reverse current, as shown in FIG. 4C, in the path leading from the P-type diffusion layer 12 and backgate of the MOS transistor M1 to the supply voltage Vdd, there is often provided a diode Da having the supply voltage Vdd applied to the anode thereof. Inconveniently, however, this diode provided for protection against a reverse current causes a voltage loss.

There has conventionally been proposed an output stage circuit wherein a reverse current is prevented without causing a voltage loss as is caused by an anti-reverse-current diode as described above (Japanese Patent Application No. H10-341141). In the output stage circuit proposed in this publication, a switch is provided in the path leading from the source and backgate of a P-channel MOS transistor to the supply voltage so that, when a supply voltage monitoring circuit recognizes a drop in the supply voltage, the switch is turned off to thereby prevent a reverse current.

However, the supply voltage monitoring circuit provided for protection against a reverse current according to the Japanese Patent Application No. H10-341141 mentioned above is composed of inverters or NAND gates and thus, when it is operating normally, a P-channel MOS transistor that functions as the switch is kept on by receiving at the gate thereof a ground voltage from the supply voltage monitoring circuit. That is, while in use, the P-channel MOS transistor used as the switch keeps continuously receiving at the gate thereof the ground potential, and this makes the P-channel MOS transistor used as the switch susceptible to breakdown. To prevent breakdown, it is necessary to set the supply voltage Vdd to be lower than the withstand voltage, and this limits the application of such a configuration.

SUMMARY OF THE INVENTION

An object of the present invention is to provide a semiconductor integrated circuit device that operates in a wider supply voltage range without being susceptible to breakdown.

To achieve the above object, according to one aspect of the present invention, a semiconductor integrated circuit device is provided with: a first MOS transistor having a first backgate region, a first conductive region, and a second conductive region, and having the first backgate region and the first conductive region thereof connected together; a second MOS transistor having a second backgate region, a third conductive region, and a fourth conductive region, having the second backgate region and the third conductive region thereof connected to the first backgate region and the first conductive region of the first MOS transistor, and receiving at the fourth conductive region thereof a first direct-current voltage; a voltage setting circuit setting a second direct-current voltage fed to the gate of the second MOS transistor; and an anti-reverse-current element receiving the first direct-current voltage or a third direct-current voltage produced from the first direct-current voltage, and connected to the voltage setting circuit in such a way as to prevent a reverse current from flowing through the voltage setting circuit. Here, the voltage setting circuit produces, according to the first direct-current voltage or the third direct-current voltage, the second direct-current voltage within the withstand voltage range of the second MOS transistor.

In this configuration, in a reversely biased state, the anti-reverse-current element prevents a reverse current from flowing through the voltage setting circuit. Thus, the voltage setting circuit does not output a voltage within the driving range of the second MOS transistor, and this causes the second MOS transistor to be turned off. Moreover, the second direct-current voltage is so adjusted as to be within the withstand voltage of the second MOS transistor. Thus, the second direct-current voltage is made commensurate with the voltage applied to the second MOS transistor, and this prevents the breakdown of the second MOS transistor.

According to another aspect of the present invention, a semiconductor integrated circuit device is provided with: a first MOS transistor of a P-channel type having a backgate and a first P-type diffusion layer thereof connected together; a second MOS transistor of a P-channel type having a backgate and a third P-type diffusion layer thereof connected to the backgate and the first P-type diffusion layer of the first MOS transistor, and receiving at a fourth P-type diffusion layer thereof a first direct-current voltage; a voltage-division resistor circuit having one end thereof grounded, and feeding, as a second direct-current voltage, a division voltage produced thereby to the gate of the second MOS transistor; and a diode receiving at the anode thereof the first direct-current voltage or a third direct-current voltage produced from the first direct-current voltage, and having the cathode thereof connected to the other end of the voltage-division resistor circuit. Here, the second direct-current voltage from the voltage-division resistor circuit is kept within the withstand voltage range of the second MOS transistor according to the first direct-current voltage or the third direct-current voltage.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
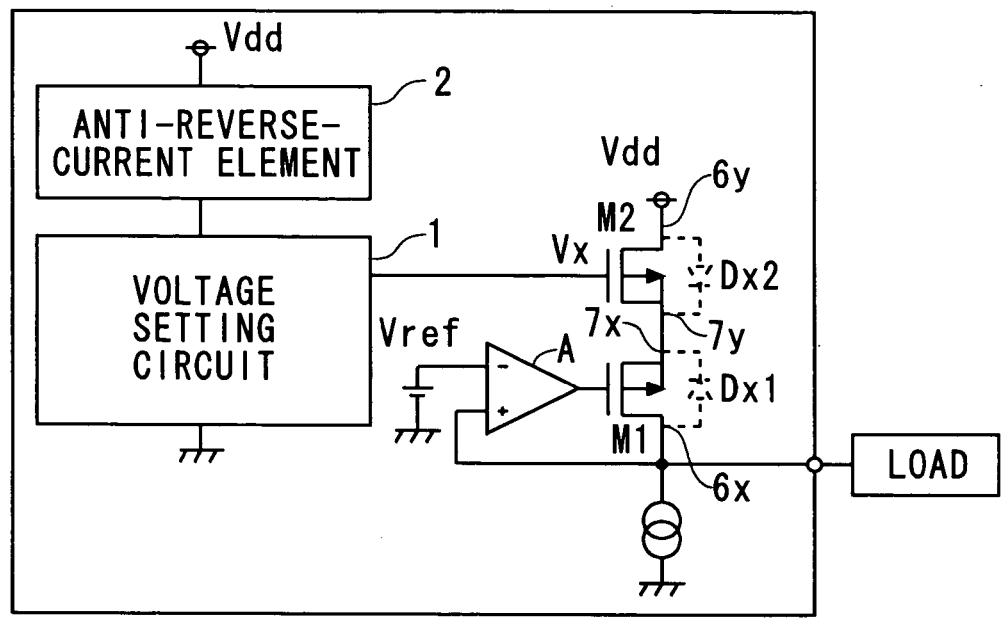
FIG. 1 is a block circuit diagram showing the configuration of a semiconductor integrated circuit device embodying the present invention.

Hereinafter, an embodiment of the present invention will be described with reference to the drawings. FIG. 1 is a circuit block diagram showing the internal configuration of a semiconductor integrated circuit device embodying the invention.

The semiconductor integrated circuit device shown in FIG. 1 is provided with a P-channel MOS transistor M1 having a DMOS structure; an operational amplifier A of which the output terminal is connected to the gate of the MOS transistor M1; a MOS transistor M2 of which a conductive terminal 7y and a backgate are connected to a conductive terminal 7x and a backgate of the MOS transistor M1; a voltage setting circuit 1 that applies a predetermined voltage Vx to the gate of the MOS transistor M2; and an anti-reverse-current element 2 that prevents a reverse current from flowing out of the voltage setting circuit 1. The voltage that appears at another conductive terminal 6x of the MOS transistor M1 is fed, as an output voltage, to an external load.

A supply voltage Vdd is fed to the anti-reverse-current element 2, and to another conductive terminal 6y of the MOS transistor M2. The operational amplifier A has the non-inverting input terminal thereof connected to the conductive terminal 6x of the MOS transistor M1, and receives at the inverting input terminal thereof a voltage Vref. In the MOS transistor M1, a parasitic diode Dx1 is formed from the conductive terminal 6x to the backgate, and, in the MOS transistor M2, a parasitic diode Dx2 is formed from the conductive terminal 6y to the backgate. These parasitic diodes Dx1 and Dx2 have the cathodes thereof connected together. The reason that the MOS transistor M1 is given a DMOS structure is that it needs to have a withstand voltage so high as to withstand the comparatively high supply voltage Vdd. In a case where the supply voltage Vdd is not so high, a common P-channel MOS transistor may be used instead.

Figure 2:
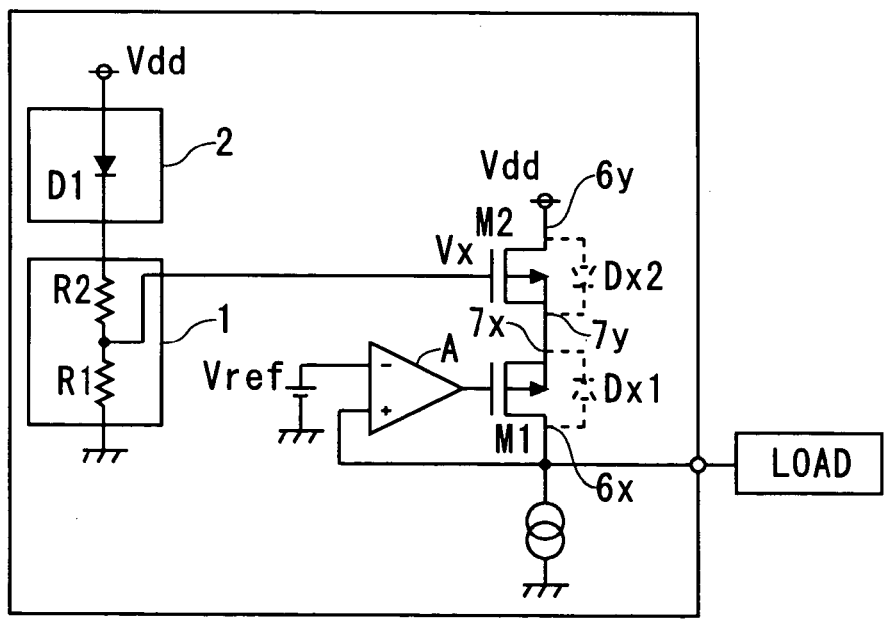
FIG. 2 is a circuit diagram showing, in more detail, an example of the circuit configuration shown in FIG. 1.

In the semiconductor integrated circuit device configured as described above, as shown in FIG. 2, the anti-reverse-current element 2 is built with a diode D1 having the supply voltage Vdd applied to the anode thereof, and the voltage setting circuit 1 is built with voltage-division resistors R1 and R2. Here, in the voltage setting circuit 1, one end of the resistor R1 is grounded, one end of the resistor R2 is connected to the cathode of the diode D1, and the node between the resistors R1 and R2 is connected to the gate of the MOS transistor M2.

Figure 3:
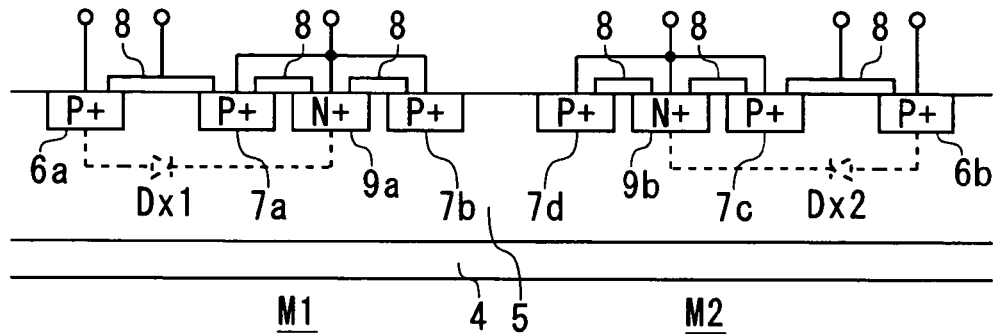
FIG. 3 is a sectional view showing the structure of a MOS transistor having a DMOS structure.

The MOS transistors M1 and M2 are each a MOS transistor having a DMOS structure as shown in a schematic sectional view in FIG. 3. Specifically, the MOS transistor M1 is provided with a P-type diffusion layer 6a (corresponding to the conductive terminal 6x shown in FIGS. 1 and 2) formed in an N-type well layer 5 formed on a P-type semiconductor substrate 4; and P-type diffusion layers 7a and 7b (corresponding to the conductive terminal 7x shown in FIGS. 1 and 2) likewise formed in the N-type well layer 5. A gate is formed so as to cover the portion of the surface of the N-type well layer 5 located between the P-type diffusion layers 6a and 7a with an insulating film 8 laid in between. Moreover, between the P-type diffusion layers 7a and 7b, there is formed an N-type diffusion layer 9a functioning as a backgate, which is electrically connected to the P-type diffusion layers 7a and 7b. In this structure, the P-type diffusion layers 7a and 7b are formed in the same layer and in such a way as to surround the N-type diffusion layer 9a functioning as the backgate.

On the other hand, the MOS transistor M2 is provided with a P-type diffusion layer 6b (corresponding to the conductive terminal 6y shown in FIGS. 1 and 2) and P-type diffusion layers 7c and 7d (corresponding to the conductive terminal 7y shown in FIGS. 1 and 2), all formed in the N-type well layer 5. A gate is formed so as to cover the portion of the surface of the N-type well layer 5 located between the P-type diffusion layers 6b and 7c with an insulating film 8 laid in between. Moreover, between the P-type diffusion layers 7c and 7d, there is formed an N-type diffusion layer 9b functioning as a backgate, which is electrically connected to the P-type diffusion layers 7c and 7d. In this structure, the P-type diffusion layers 7c and 7d are formed in the same layer and in such a way as to surround the N-type diffusion layer 9b functioning as the backgate. The P-type diffusion layers 7b and 7d do not necessarily have to be formed in the same layer.

When the semiconductor integrated circuit device configured as described above is operating normally, the MOS transistor M2 receives at the gate thereof a voltage Vx from the voltage setting circuit 1 and is thereby turned on. Here, the voltage setting circuit 1 has the resistances of its constituent resistors R1 and R2 so adjusted as to produce, as a division voltage, the voltage Vx such that the potential difference of the voltage Vx from the supply voltage Vdd is greater than the threshold voltage Vth between the gate and conductive terminal 7y of the MOS transistor M2 and is simultaneously lower than the breakdown voltage VB of the MOS transistor M2. Specifically, the division voltage Vx is so adjusted as to fulfill $0 \leqq Vx < Vdd - Vth$ and $Vdd - Vx < VB$.

When the MOS transistor M2 is turned on in this way, the MOS transistor M1 receives at the conductive terminal 7x and backgate thereof a voltage lower than the supply voltage Vdd by the voltage drop across the on-state resistance of the MOS transistor M2. Moreover, the MOS transistor M1 is controlled by the operational amplifier A so as to output, as an output voltage, the voltage that appears at the conductive terminal 6x of the MOS transistor M1. Moreover, the operational amplifier A compares the voltage that appears at the conductive terminal 6x of the MOS transistor M1 with the reference voltage Vref to control the gate voltage of the MOS transistor M1 so that the voltage that appears at the conductive terminal 6x of the MOS transistor M1 remains constant.

Figure 4A:
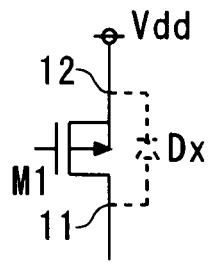
FIGS. 4A to 4C are diagrams showing the configuration and structure of a conventional semiconductor integrated circuit device.
Figure 4B:
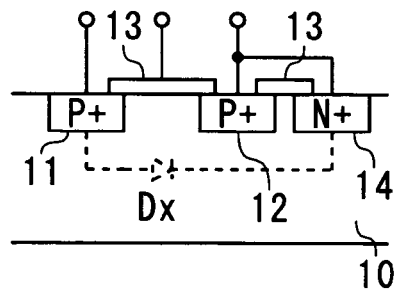
Figure 4C:
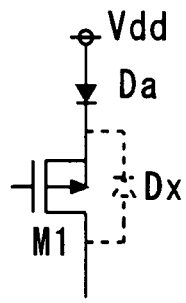

Here, by setting the on-state resistance of the MOS transistor M2 to be lower than 0.1 [Ω], even if a current as large as 5 [A] flows through the MOS transistor M2, the voltage drop across it can be reduced to 0.5 [V], which is lower than the voltage drop 0.7 [V] across the diode Da shown in FIG. 4A.

When the semiconductor integrated circuit device configured as described above is reversely biased by accident, and the supply voltage Vdd becomes lower than the ground voltage, in the first place, the diode D1 functioning as the anti-reverse-current element 2 permits no current to flow, and thus prevents a current from flowing into the voltage setting circuit 1 from the ground voltage side. Accordingly, the ground voltage appears at the node between the resistors R1 and R2, and this ground voltage is fed, as the output voltage Vx of the voltage setting circuit 1, to the gate of the MOS transistor M2.

At this time, the supply voltage Vdd, which is now lower than the ground voltage due to the reversely biased state, is applied also to the conductive terminal 6y of the MOS transistor M2. Thus, the MOS transistors M1 and M2 remain off. At this time, although the parasitic diode Dx1 is formed in the MOS transistor M1, the parasitic diode Dx2 formed in the MOS transistor M2 prevents a current from flowing from the conductive terminal 7y and backgate of the MOS transistor M2 to the conductive terminal 6y thereof. This prevents a reverse current from flowing through the parasitic diode Dx1.

In this configuration, when the MOS transistor M2 is operating, the voltage applied to the gate thereof is adjusted according to the supply voltage applied to the conductive terminal 6y thereof by the voltage setting circuit 1 so as not to be so high as to cause the breakdown of the MOS transistor M2. That is, the voltage setting circuit 1 adjusts the voltage fed to the gate of the MOS transistor M2 in such a way that it becomes higher or lower as the supply voltage applied to the conductive terminal 6y of the MOS transistor M2 becomes higher or lower, respectively.

In this embodiment, the voltage applied to the anti-reverse-current element 2 and the voltage applied to the conductive terminal 6y of the MOS transistor M2 are equal, namely Vdd. These voltages, however, do not need to be equal; that is, different voltages may be applied to the anti-reverse-current element 2 and to the conductive terminal 6y of the MOS transistor M2. This is achieved, for example, by providing a regulator that receives a single supply voltage Vdd, converts it into different voltages Vdd1 and Vdd2, and then feeds them to the anode side of the anti-reverse-current element 2 and to the conductive terminal 6y of the MOS transistor M2, respectively. The anti-reverse-current element 2 may be built with a plurality of diodes, or with a diode-connected transistor. A similar circuit configuration can be realized by using, as the MOS transistor M1, an N-channel MOS transistor instead of a P-channel MOS transistor.

According to the present invention, in a reversely biased state, a reverse current through a parasitic diode formed in a first MOS transistor is prevented by a parasitic diode formed in a second MOS transistor. Moreover, in the reversely biased state, an anti-reverse-current element prevents a reverse current through a voltage setting circuit. This makes it possible to turn the second MOS transistor off and thereby prevent a reverse current in a semiconductor integrated circuit device. Furthermore, the voltage setting circuit feeds the second MOS transistor with a second direct-current voltage that is within the withstand voltage range of the second MOS transistor. This helps to prevent the breakdown of the first and second MOS transistors. Moreover, this second direct-current voltage can be adjusted according to the supply voltage. This makes it possible to prevent the breakdown of the first and second MOS transistors irrespective of the level of the supply voltage.

What is claimed is:

1. A semiconductor integrated circuit device comprising:
a first MOS transistor
having a first backgate region, a first conductive region, and a second conductive region, and
having the first backgate region and the first conductive region thereof connected together;
a second MOS transistor, of a same conductivity type as the first MOS transistor,
having a second backgate region, a third conductive region, and a fourth conductive region,
having the second backgate region and the third conductive region thereof connected to the first backgate region and the first conductive region of the first MOS transistor, and
receiving at the fourth conductive region thereof a first direct-current voltage;
a voltage setting circuit
setting a second direct-current voltage fed to a gate of the second MOS transistor;
an anti-reverse-current element
receiving the first direct-current voltage or a third direct-current voltage produced from the first direct-current voltage, and
connected to the voltage setting circuit in such a way as to prevent a reverse current from flowing through the voltage setting circuit; and
a feedback circuit
outputting to a gate of the first MOS transistor a value obtained by comparing a voltage at the second conductive region of the first MOS transistor with a reference voltage,
wherein the voltage setting circuit produces, according to the first direct-current voltage or the third direct-current voltage, the second direct-current voltage within a withstand voltage range of the second MOS transistor,
wherein a load is connected to the second conductive region of the first MOS transistor, and
wherein, between the first backgate region and the second conducting region of the first MOS transistor, a first parasitic diode is formed and, between the second backgate region and the fourth conducting region of the second MOS transistor, a second parasitic diode is formed.

2. A semiconductor integrated circuit device as claimed in claim 1,
wherein the anti-reverse-current element is a diode.

3. A semiconductor integrated circuit device as claimed in claim 1,
wherein the voltage setting circuit is composed of voltage-division resistors.

4. A semiconductor integrated circuit device comprising:
a first MOS transistor of a P-channel type
including a backgate, a first P-type diffusion layer, and a second P-type diffusion layer, and
having the backgate and the first P-type diffusion layer thereof connected together;
a second MOS transistor of a P-channel type
having a backgate and a third P-type diffusion layer thereof connected to the backgate and the first P-type diffusion layer of the first MOS transistor, and
receiving at a fourth P-type diffusion layer thereof a first direct-current voltage;
a voltage-division resistor circuit
having one end thereof grounded, and
feeding, as a second direct-current voltage, a division voltage produced thereby to a gate of the second MOS transistor;
a diode
receiving at an anode thereof the first direct-current voltage or a third direct-current voltage produced from the first direct-current voltage, and having a cathode thereof connected to another end of the voltage-division resistor; and an operational amplifier receiving at a non-inverting input terminal thereof a voltage at the second P-type diffusion layer of the first MOS transistor, receiving at an inverting input terminal thereof a reference voltage, and outputting to a gate of the first MOS transistor a value obtained by comparing the voltage at the second P-type diffusion layer with the reference voltage, wherein the second direct-current voltage from the voltage-division resistor circuit is kept within a withstand voltage range of the second MOS transistor according to the first direct-current voltage or the third direct-current voltage, wherein a load is connected to the second P-type diffusion layer of the first MOS transistor, and wherein, between the first backgate and the second P-type diffusion layer of the first MOS transistor, a first parasitic diode is formed and, between the second backgate and the fourth P-type diffusion layer of the second MOS transistor, a second parasitic diode is formed.

5. A semiconductor integrated circuit device as claimed in claim 4, further comprising:

a constant current source that is connected to the second P-type diffusion layer of the first MOS transistor.

* * * * *